(12) United States Patent
La Rosa

(10) Patent No.: US 6,760,265 B2
(45) Date of Patent: Jul. 6, 2004

(54) READ AMPLIFIER WITH A LOW CURRENT CONSUMPTION DIFFERENTIAL OUTPUT STAGE

(75) Inventor: Francesco La Rosa, Rousset (FR)

(73) Assignee: STMicroelectronics SA, Montrouge (FR)

( * ) Notice: Subject to any disclaimer, the term of this patent is extended or adjusted under 35 U.S.C. 154(b) by 43 days.

(21) Appl. No.: 10/299,965

(22) Filed: Nov. 19, 2002

(65) Prior Publication Data

US 2003/0095453 A1 May 22, 2003

(30) Foreign Application Priority Data

Nov. 20, 2001 (FR) .............................. 01 14969

(51) Int. Cl.[7] .................................................. G11C 7/00
(52) U.S. Cl. .................................. 365/207; 365/185.21
(58) Field of Search ............................... 365/207, 210, 365/185.21; 327/51, 52

(56) References Cited

U.S. PATENT DOCUMENTS 5,363,340 A  * 11/1994 Ishikawa et al. ......... 365/233.5
5,754,010 A    5/1998 Caravella et al. .......... 365/203
6,442,090 B1 *  8/2002 Ahmed et al. ............. 365/207
2001/0024381 A1   9/2001 Fuchigami et al. ........ 365/185

OTHER PUBLICATIONS

Johnson Mark G.: An Input–Free $V_T$ Extractor Circuit Using a Two–Transistor Differential Amplifier.

* cited by examiner

Primary Examiner—Tan T. Nguyen
(74) Attorney, Agent, or Firm—Lisa K. Jorgenson; Allen, Dyer, Doppelt, Milbrath & Gilchrist, P.A.

(57) ABSTRACT

A read amplifier includes a read stage, a reference stage and a differential output stage that includes PMOS and NMOS transistors. The transistors of the differential stage include only one PMOS transistor and only one NMOS transistor in series. The PMOS transistor has its gate linked to one node of the read stage. The NMOS transistor has its gate linked to one node of the reference stage. The mid-point of the PMOS and NMOS transistors of the differential stage form a data output node of the read amplifier.

13 Claims, 3 Drawing Sheets

READ AMPLIFIER WITH A LOW CURRENT CONSUMPTION DIFFERENTIAL OUTPUT STAGE

FIELD OF THE INVENTION

The present invention relates to a non-volatile memory cell read amplifier, applicable, in particular, to EPROM, EEPROM, and FLASH EEPROM memories. The present invention relates more particularly to a read amplifier with a differential output stage.

BACKGROUND OF THE INVENTION

To read data present in a non-volatile memory cell, the programmed or erased state of which determines the value of the data saved in the memory cell, it is common to use a read amplifier to detect the programmed or erased state of the cell by comparing a current passing through the cell with a reference current. The programed state corresponds conventionally to the storage of a 0 and the erased state to the storage of a 1, or vice-versa. Some known read amplifiers comprise an output stage formed by an inverting gate, while others comprise a differential output stage.

A prior art read amplifier with a differential output stage is represented in FIG. 1. In this figure and in the rest of the present application, PMOS type transistors are designated by references starting by "TP" and NMOS type transistors are designated by references starting by "TN".

The read amplifier SA1 comprises a reference stage RFST, a read stage RDST and a differential stage DIFST1 electrically supplied by a voltage Vcc and receiving a reference voltage Vref delivered by a generator RGEN. The read amplifier SA1 has an output node SENSEOUT to be linked to a memory cell to be read, and an output node DATAOUT delivering data at 1 (Vcc) or at 0 (ground) depending on the conductivity state of the memory cell.

The generator RGEN comprises for example a transistor TP0, the source S of which receives the voltage Vcc, the drain D of which is connected to a current generator IGEN, and the gate G of which is linked to the drain D. The transistor TP0 is passed through by a current Iref imposed by the current generator IGEN, and the voltage Vref is sampled at its gate G.

The reference stage RFST comprises two transistors TP1, TN1 in series. The transistor TP1 receives the voltage Vcc at its source, the signal Vref at its gate, and its drain is connected to the drain of the transistor TN1, the source of which is linked to ground.

The read stage RDST comprises two transistors TP2, TN2 in series. The transistor TP2 receives the voltage Vcc at its source, the voltage Vref at its gate, and its drain is connected to the drain of the transistor TN2. The source of the transistor TN2 is connected to the gate of the transistor TN1 and forms the output SENSEOUT of the read amplifier, at which a voltage $V_{SENSE}$ is found.

The differential output stage DIFST1 comprises a first branch comprising two transistors TP3, TN3 in series and a second branch comprising two transistors TP4, TN4 in series. The transistor TP3 receives the voltage Vcc at its source, a voltage $V_{MAT}$ sampled from the drain of the transistor TP2 (also the drain of the transistor TN2) at its gate, and its drain is connected to the drain of the transistor TN3, the source of which is linked to ground. The transistor TP4 receives the voltage Vcc at its source, the voltage Vref at its gate, and its drain is connected to the drain of the transistor TN4, the source of which is linked to ground. The transistor TN4 has its drain connected to its gate, and its gate is connected to the gate of the transistor TN3. The output DATAOUT is formed by the mid-point of the transistors TP3, TN3, i.e., the drain of the transistor TP3 and the drain of the transistor TN3.

The read amplifier also comprises a precharge transistor TP5, the source of which receives the voltage Vcc, and the drain of which is linked to the drain of the transistor TN2. The gate of the transistor TP5 is driven by a voltage Vp. The transistors TP0, TP1, TP2, TP3, TP4 are preferably identical and the transistors TN1, TN2, TN3, TN4 are also identical (same gate aspect ratio).

As an example of an application, it will now be assumed that the output SENSEOUT is linked to a memory cell MCELL through a column decoder COLDEC and a bit line BLj of a memory array MA. The memory cell comprises a floating-gate transistor FGT receiving a read voltage Vread at its gate and the conductivity state of which depends on its programmed or erased state.

The reading of the memory cell MCELL is preceded by a precharge phase during which the voltage Vp is taken to 0. The transistor TP5 is in a transmission state and a precharge current is delivered by the output SENSEOUT. This precharge current charges stray capacitances of the bit line BLj and brings the voltage $V_{SENSE}$ to a determined value, in the order of Vtn (threshold voltage of an NMOS transistor). The transistor TP5 allows the precharge time to be accelerated and, as a result, the global read time, as the transistor TP2 operates as a current generator and is not capable of delivering a high precharge current. During the precharge phase, the voltage $V_{MAT}$ is equal to Vcc and the transistor TP3 is blocked. The transistor TN4 is passed through by the current Iref present in the generator RGEN based upon a current mirror effect between the transistors TP4 and TP0. The transistor TN3 is also passed through by the current Iref based upon a current mirror effect with the transistor TN3. The output DATAOUT is therefore at 0.

The read step starts when the voltage Vp is taken to Vcc. The transistor TP5 is then blocked. The output SENSEOUT delivers in the bit line BLj a current Icell, the value of which depends on the conductivity state of the memory cell MCELL. The reference stage RFST is passed through by the current Iref by the current mirror effect between the transistors TP1 and TP0, and the drain of the transistor TP2 of the read stage RDST also delivers the current Iref by the current mirror effect with the transistor TP0. If the current Icell is higher than Iref, the voltage $V_{MAT}$ drops, the transistor TP3 goes into a transmission state and the output DATAOUT goes to 1. If the current Icell is lower than Iref, the voltage $V_{KAT}$ stays at the high level and the output DATAOUT stays at 0.

As indicated above, other types of read amplifiers comprise an output stage with an inverting gate. In this case, the differential stage DIFST1 is replaced by an inverting gate that receives the signal $V_{MAT}$ at input and the output of which forms the output DATAOUT of the read amplifier. In this case, the output DATAOUT is at 1 or at 0 depending on whether the signal $V_{MAT}$ is lower or higher than a trip point of the inverting gate.

The advantage of a read amplifier with a differential output stage of the type that has just been described is that it is accurate because the value of the output DATAOUT does not depend on the trip point of an inverting gate, and is a function of a comparison of the voltage $V_{MAT}$ with the reference voltage Vref. Therefore, the output DATAOUT goes to 0 as soon as $V_{MAT}$ becomes lower than Vref.

Another advantage of such a read amplifier is that it has a short read time as the voltage Vref is generally higher than the trip point of an inverting gate, such that the detection of the low level of the voltage $V_{MAT}$ is faster with a differential stage than with an inverting gate. However, such a read amplifier has a double drawback. First, the differential output stage is more complex than an output stage with an inverting gate (two MOS transistors being sufficient to obtain an inverting gate). Furthermore, the electrical consumption of the differential output stage is considerable while the electrical consumption of an inverting gate is zero outside commutation periods.

SUMMARY OF THE INVENTION

An object of the present invention is to provide a read amplifier of the type described above in which the differential stage is of a simpler structure and has a lower current consumption.

This object is achieved by providing a read amplifier comprising a read stage linked or intended to be linked to a memory cell that is to be read, a reference stage that is passed through by a reference current, and a differential output stage comprising PMOS and NMOS type transistors. The transistors of the differential stage may comprise only one PMOS transistor and one NMOS transistor in series. The PMOS transistor may have its gate linked to one node of the read stage. The NMOS transistor may have its gate linked to the gate of a transistor of the reference stage on which a gate voltage occurs that is representative of the reference current. The mid-point of the PMOS and NMOS transistors may form a data output node of the read amplifier.

According to one embodiment, the read stage may comprise a PMOS transistor receiving a reference voltage at its gate, in series with an NMOS transistor the source of which forms a link point of the read amplifier to a memory cell. The drain of the PMOS transistor of the read stage may be linked to the gate of the PMOS transistor of the differential stage.

According to another embodiment, the reference stage may comprise a PMOS transistor receiving the reference voltage at its gate, in series with an NMOS transistor having its gate linked to the gate of the NMOS transistor of the differential stage.

According to one embodiment, the gate of the NMOS transistor of the read stage may be linked to the drain of the NMOS transistor of the reference stage. The gate of the NMOS transistor of the reference stage may be linked to the source of the NMOS transistor of the read stage.

According to another embodiment, the read amplifier may comprise a precharge transistor linked to the drain of the NMOS transistor of the read stage. The precharge transistor may have its gate driven by the data output node of the read amplifier.

The present invention also relates to a non-volatile memory comprising a memory array having at least one memory cell, and at least one read amplifier as defined above. The memory cell may comprise a floating-gate transistor.

BRIEF DESCRIPTION OF THE DRAWINGS

These and other objects, advantages and features of the present invention shall be explained in greater detail in the following description of a read amplifier according to the present invention, and of an embodiment of this read amplifier, given in relation with, but not limited to, the following figures, in which.

DETAILED DESCRIPTION OF THE PREFERRED EMBODIMENTS

Figure 2:
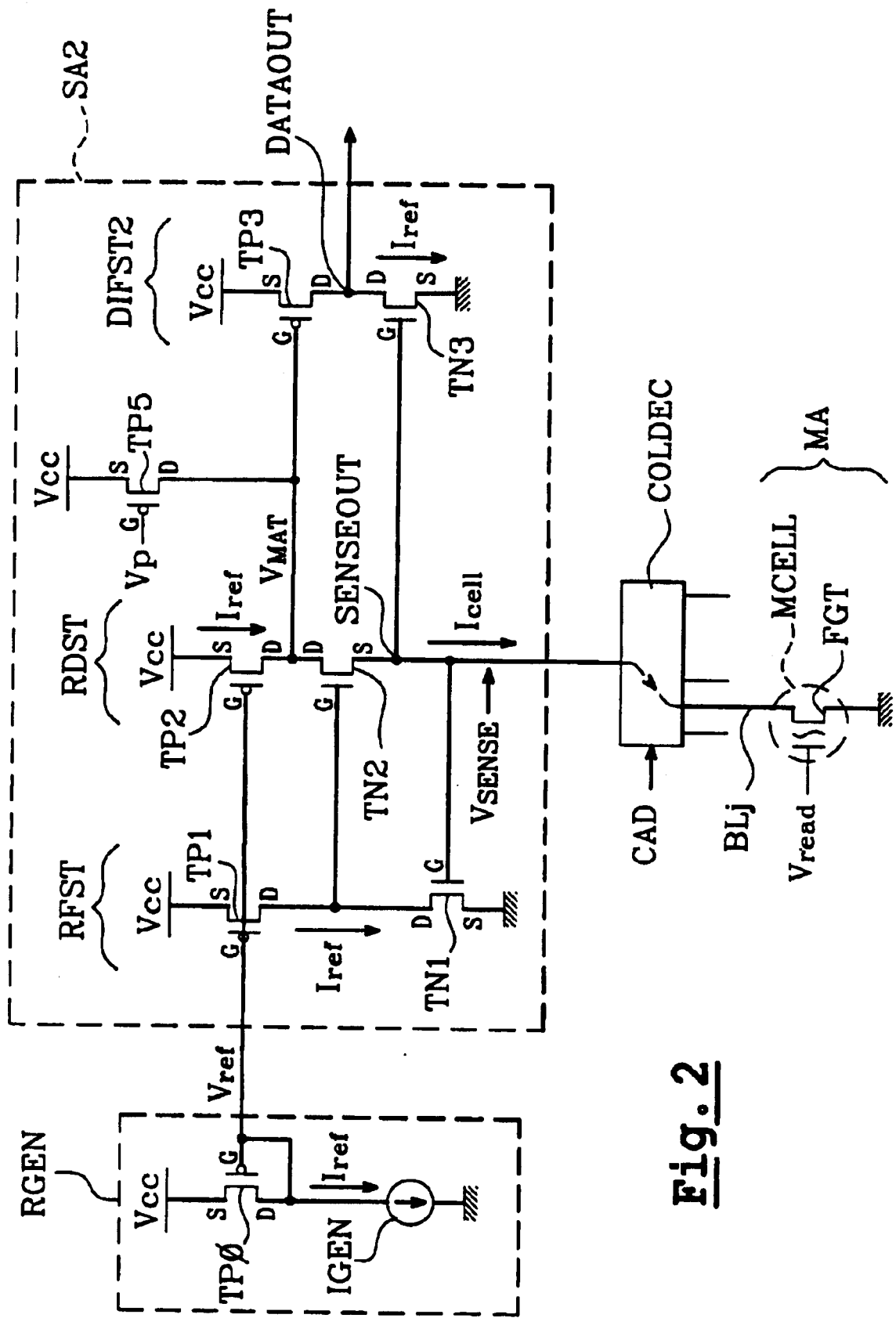
FIG. 2 is a wiring diagram of a read amplifier with a differential output stage according to the present invention.

FIG. 2 represents a read amplifier SA2 according to the present invention. The read amplifier comprises a reference stage RFST, a read stage RDST and a differential stage DIFST2 electrically supplied by a voltage Vcc and receiving a reference voltage Vref delivered by a generator RGEN. It has an output node SENSEOUT to be linked to a memory cell that is to be read, and an output node DATAOUT delivering data at 1 (Vcc) or at 0 (ground) depending on the conductivity state of the memory cell.

The reference stage RFST, the read stage RDST and the reference generator RGEN are identical to those described above in relation with FIG. 1. The same elements are designated by the same references.

The generator RGEN comprises a transistor TP0 the source S of which receives the voltage Vcc, the drain D of which is connected to a current generator IGEN, and the gate G of which is linked to the drain D. The transistor TP0 is passed through by a current Iref imposed by the current generator IGEN, and the voltage Vref is sampled at its gate G. The reference stage RFST comprises two transistors TP1, TN1 in series. The transistor TP1 receives the voltage Vcc at its source, the signal Vref at its gate, and its drain is connected to the drain of the transistor TN1, the source of which is linked to ground. The read stage RDST comprises two transistors TP2, TN2 in series. The transistor TP2 receives the voltage Vcc at its source, the voltage Vref at its gate, and its drain is connected to the drain of the transistor TN2. The source of the transistor TN2 forms the output node SENSEOUT of the read amplifier and is connected to the gate of the transistor TN1, which imposes the voltage $V_{SENSE}$ on the output node SENSEOUT.

The read amplifier also comprises, in a known manner, a precharge transistor TP5. The source of which receives the voltage Vcc, the drain of which is linked to the drain of the transistor TN2, and the gate of the transistor TP5 is driven by a voltage Vp.

According to the present invention, the differential output stage DIFST2 comprises a single branch comprising only two transistors TP3, TN3 in series. The output node DATAOUT is the mid-point of the transistors TP3, TN3, i.e., the connection point of the drain of the transistor TP3 and of the drain of the transistor TN3. The transistor TP3 receives the voltage Vcc at its source, the voltage $V_{MAT}$ is sampled on the drain of the transistor TP2 (also the drain of the transistor TN2) at its gate, and its drain is connected to the drain of the transistor TN3. The transistor TN3 has its source linked to ground, and its gate receives the voltage $V_{SENSE}$ present at the gate of the transistor TN1 and at the output node SENSEOUT.

Figure 1:
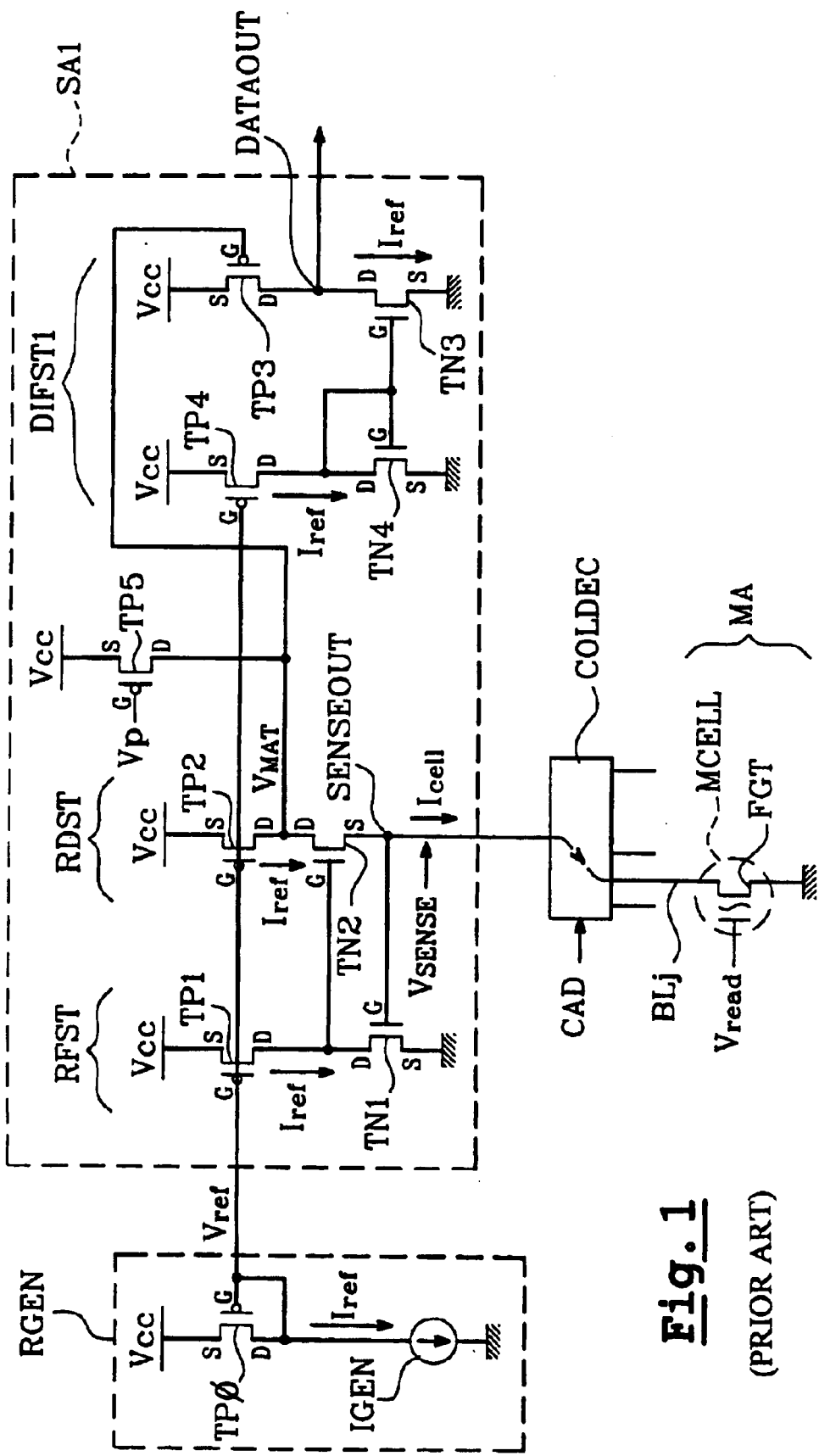
FIG. 1 is a wiring diagram of a read amplifier with a differential output stage according to the prior art.

The stage DIFST2 is therefore the equivalent of the stage DIFST1 in FIG. 1 in which the transistors TP4 and TN4 have been removed and the gate drive signal of the transistor TN3 has been changed, which is now the voltage $V_{SENSE}$ instead of the gate voltage of the removed transistor TN4.

The present invention is, in fact, based on the observation according to which, in the prior art read amplifier in FIG. 1, the function of the transistor TN4 is to apply a control voltage representative of the reference current Iref to the gate of the transistor TN3. However, in the reference stage RFST, the transistor TP1 has its gate biased by the voltage Vref and imposes the current Iref in the transistor TN1. The gate voltage of the transistor TN1, i.e., the voltage $V_{SENSE}$, is therefore itself representative of the reference current Iref.

The voltage $V_{SENSE}$ is particularly equal to the gate voltage of the transistor TN4 when TP1=TP4 and TN1=TN4 (same gate aspect ratio). The transistors TN1 and TN4 are passed through by the same current and both operate in a saturated mode. Therefore, the removal of the transistors TP4 and TN4 does not change the operation of the read amplifier if the voltage $V_{SENSE}$ is used to drive the gate of the transistor TN3, instead of using the gate voltage of the transistor TN4.

The removal of the transistors TN4 and TP4 can also be considered when the transistors TP1 and TP4 do not have the same dimensions. It will be assumed for example that TP4=2*TP1 (gate aspect ratio of TP4 is double that of TP1). In this case, the voltage $V_{SENSE}$ corresponds to a current that is equal to half of the current passing through the transistor TN4. The voltage $V_{SENSE}$ remains useable however to drive the gate of the transistor TN3, as it is always representative of the reference current Iref. Therefore, the transistor TN4 and, as a result, the transistor TP4 can be removed.

In one preferred embodiment, the transistors TP0, TP2 and TP3 are identical and the transistors TN1, TN2 and TN3 are also identical (same gate aspect ratio).

Such an improvement of the differential stage noticeably reduces the electrical consumption of the read amplifier SA2 without affecting its performances in terms of reading speed. In fact, in FIG. 1, the branch comprising the transistors TP4 and TN4 consumes current permanently when the read amplifier is on and it is receiving the voltage Vref. The removal of this branch therefore leads to a corresponding reduction in the current consumption.

Moreover, the reduction of the electrical consumption of the read amplifier gives those skilled in the art an additional degree of freedom to optimize the reading speed. The electrical consumption is one of the factors that limits the possibilities of improving the reading speed of a read amplifier at the design stage, particularly at the stage of determining the size of the transistors.

Another advantage of the present invention is that the removal of the translator TP4 leads to a reduction in the stray capacitance on the voltage Vref distribution line. This reduction is on the order of 25% since there are only three remaining PMOS transistors compared to four connected to the generator RGEN, and improves the speed of establishing the voltage Vref at the gates of the three transistors. Therefore, a reading operation can be carried out from a standby mode in which the generator RGEN is turned off and is only reactivated at the time of the reading.

As an example of an application, it will be assumed as above that the output SENSEOUT is linked to a memory cell MCELL through a column decoder COLDEC and a bit line BLj of a memory array MA. The memory cell comprises a floating-gate transistor FGT receiving a read voltage Vread at its gate and the conductivity state of which depends on its programmed or erased state.

The reading of the memory cell MCELL is preceded by a precharge phase during which the voltage Vp is taken to 0. The transistor TP5 is in a transmission state and a precharge current is delivered by the output SENSEOUT. During the precharge phase, the voltage $V_{MAT}$ is equal to Vcc and the transistor TP3 is blocked. The transistor TN3 is passed through by the current Iref passing through the transistor TN1, as explained above. The output DATAOUT is therefore at 0.

The reading step starts when the voltage Vp is taken to Vcc. The transistor TP5 is then blocked. The output SENSEOUT delivers a current Icell that depends on the conductivity state of the memory cell MCELL. The reference stage RFST is passed through by the current Iref based upon a current mirror effect between the transistors TP1, TP0. The drain of the transistor TP2 of the read stage RDST also delivers the current Iref based upon a current mirror effect with the transistor TP0. The output SENSEOUT delivers a current Icell that is compared to the current Iref. If the current Icell is higher than Iref, the voltage $V_{MAT}$ drops. The transistor TP3 goes into a transmission state and the output DATAOUT goes to 1 (Vcc). If the current Icell is lower than Iref, the voltage $V_{MAT}$ remains at high level and the output DATAOUT remains at 0.

Figure 3:
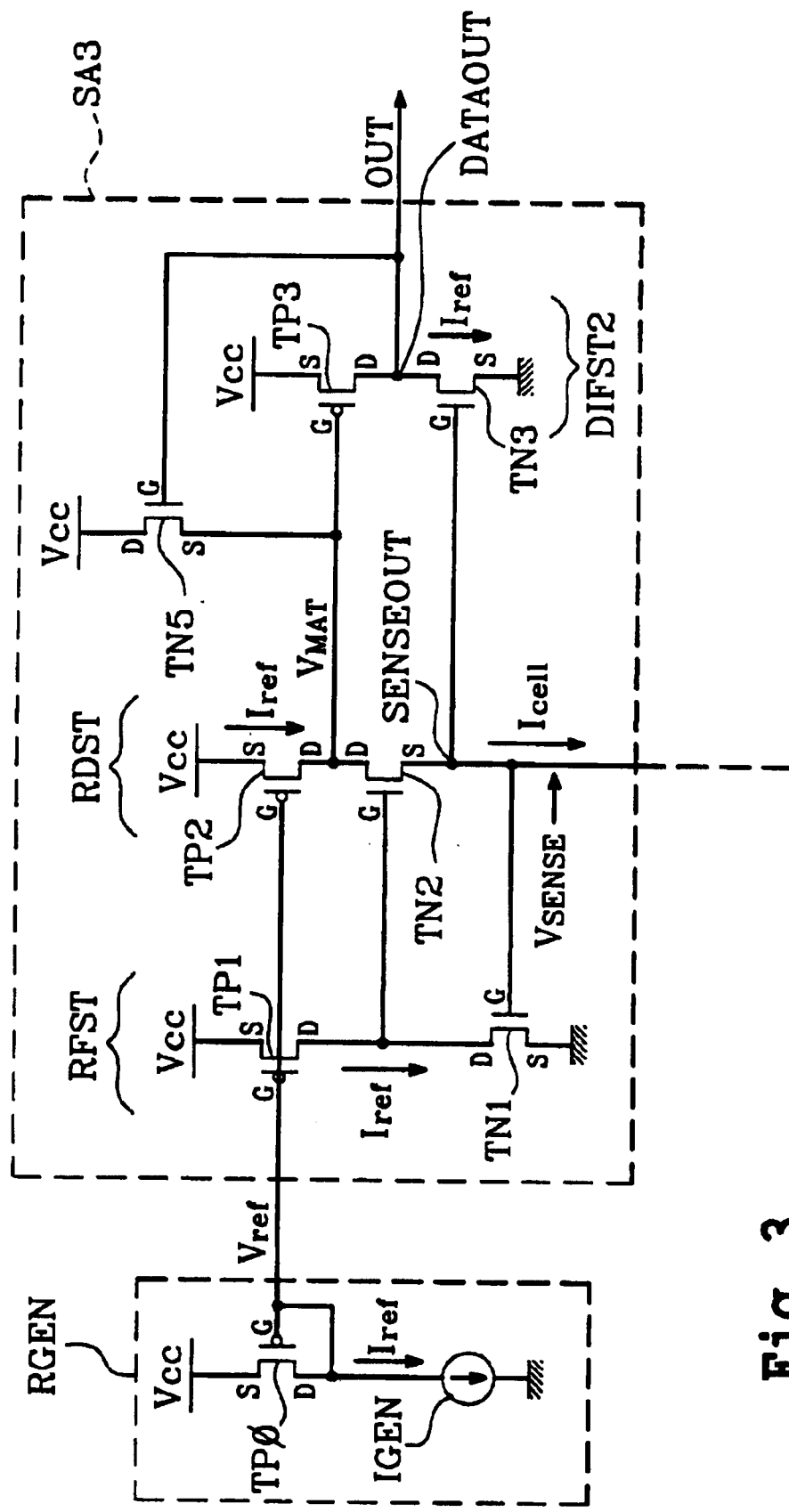
FIG. 3 is a wiring diagram of a variation of the read amplifier illustrated in FIG. 2.

FIG. 3 represents an embodiment SA3 of the read amplifier according to the present invention. This embodiment is a combination of the present invention and with the invention described by the U.S. Pat. No. 6,094,394. U.S. Pat. No. 6,094,394 is assigned to the current assignee of the present invention, and the contents of which are incorporated herein by reference in its entirety. In this embodiment, the precharge transistor TP5 is removed and is replaced by an NMOS transistor TN5, the drain of which receives the voltage Vcc and the source of which is connected to the drain of the transistor TN2. In compliance with U.S. Pat. No. 6,094,394, the gate of the precharge transistor TN5 is driven by the signal delivered by the output DATAOUT of the read amplifier.

That which is claimed is:

1. A read amplifier comprising;
   a read stage connected to a memory cell that is to be read;
   a reference stage connected to the read stage and comprising a transistor having a reference current being passed therethrough, the transistor comprising a gate and having a gate voltage representative of the reference current; and
   a differential output stage connected to the read stage and comprising only one PMOS transistor and one NMOS transistor connected in series, the PMOS transistor comprising a gate connected to a node of the read stage, the NMOS transistor comprising a gate connected to the gate of the transistor of the reference stage, and a node between the PMOS and NMOS transistors forming a data output node of the read amplifier.

2. A read amplifier according to claim 1, wherein the read stage comprises:
   a PMOS transistor comprising a gate receiving a reference voltage, and a drain connected to the gate of the PMOS transistor in the differential stage; and
   an NMOS transistor connected in series with the PMOS transistor, and comprising a source forming a node that is connected to the memory cell.

3. A read amplifier according to claim 2, wherein the transistor in the reference stage comprises an NMOS transistor, and wherein the reference stage further comprises a PMOS transistor connected in series with the NMOS transistor, the PMOS transistor comprising a gate receiving the reference voltage.

4. A read amplifier according to claim 3, wherein the gate of the NMOS transistor of the read stage is connected to the drain of the NMOS transistor of the reference stage, and the gate of the NMOS transistor of the reference stage is connected to the source of the NMOS transistor of the read stage.

5. A read amplifier according to claim 4, further comprising a precharge transistor connected to the drain of the NMOS transistor of the read stage.

6. A read amplifier (SA3) according to claim 5, wherein the precharge transistor comprises a gate being driven by the data output node of the read amplifier.

7. A non-volatile memory comprising:
a memory array comprising at least one memory cell; and
at least one read amplifier connected to the memory array and comprising
a read stage connected to the at least one memory cell that is to be
a reference stage connected to the read stage and comprising a transistor having a reference current being passed therethrough, the transistor comprising a gate and having a gate voltage representative of the reference current, and
a differential output stage connected to the read stage and comprising only one PMOS transistor and one NMOS transistor connected in series, the PMOS transistor comprising a gate connected to a node of the read stage, the NMOS transistor comprising a gate connected to the gate of the transistor of the reference stage, and a node between the PMOS and NMOS transistors forming a data output node of the read amplifier.

8. A non-volatile memory according to claim 7, wherein the at least one memory cell comprises a floating-gate transistor.

9. A non-volatile memory according to claim 7, wherein the read stage comprises:
a PMOS transistor comprising a gate receiving a reference voltage, and a drain connected to the gate of the PMOS transistor in the differential stage; and
an NMOS transistor connected in series with the PMOS transistor, and comprising a source forming a node that is connected to the at least one memory cell.

10. A non-volatile memory according to claim 9, wherein the transistor in the reference stage comprises an NMOS transistor, and wherein the reference stage further comprises a PMOS transistor connected in series with the NMOS transistor, the PMOS transistor comprising a gate receiving the reference voltage.

11. A read amplifier according to claim 10, wherein the gate of the NMOS transistor of the read stage is connected to the drain of the NMOS transistor of the reference stage, and the gate of the NMOS transistor of the reference stage is connected to the source of the NMOS transistor of the read stage.

12. A read amplifier according to claim 11, further comprising a precharge transistor connected to the drain of the NMOS transistor of the read stage.

13. A read amplifier according to claim 12, wherein the precharge transistor comprises a gate being driven by the data output node of the read amplifier.

* * * * *